(12) United States Patent
Akram et al.

(10) Patent No.: US 6,670,634 B2
(45) Date of Patent: *Dec. 30, 2003

(54) SILICON CARBIDE INTERCONNECT FOR SEMICONDUCTOR COMPONENTS

(75) Inventors: Salman Akram, Boise, ID (US); Alan G. Wood, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/351,742

(22) Filed: Jan. 27, 2003

(65) Prior Publication Data

US 2003/0143764 A1 Jul. 31, 2003

Related U.S. Application Data

(63) Continuation of application No. 09/480,027, filed on Jan. 10, 2000, now Pat. No. 6,563,215.

(51) Int. Cl.[7] .............................................. H01L 23/58
(52) U.S. Cl. ........................................ 257/48; 257/737
(58) Field of Search ................................ 257/737, 738, 257/48, 778

(56) References Cited

U.S. PATENT DOCUMENTS

| 3,962,391 A | 6/1976 | Dietze et al. |
|---|---|---|
| 4,093,201 A | 6/1978 | Dietze et al. |
| 4,203,940 A | 5/1980 | Dietze et al. |
| 4,978,567 A | 12/1990 | Miller |
| 5,031,072 A | 7/1991 | Malhi et al. |
| 5,145,741 A | 9/1992 | Quick |
| 5,419,807 A | 5/1995 | Akram et al. |
| 5,478,779 A | 12/1995 | Akram |
| 5,483,741 A | 1/1996 | Akram et al. |
| 5,519,332 A | 5/1996 | Wood et al. |
| 5,556,530 A | 9/1996 | Finkelstein et al. |
| 5,578,526 A | 11/1996 | Akram et al. |
| 5,592,736 A | 1/1997 | Akram et al. |
| 5,686,317 A | 11/1997 | Akram et al. |
| 5,716,218 A | 2/1998 | Farnworth et al. |
| 5,776,391 A | 7/1998 | Sibley |

(List continued on next page.)

Primary Examiner—Roy Potter
(74) Attorney, Agent, or Firm—Stephen A. Gratton

(57) ABSTRACT

An interconnect for semiconductor components includes a substrate, and interconnect contacts on the substrate for electrically engaging component contacts on the components. The interconnect contacts include silicon carbide conductive layers, and conductors in electrical communication with the silicon carbide conductive layers. The silicon carbide conductive layers provides a wear resistant surface, and improved heat transfer between the component contacts and the interconnect contacts. The silicon carbide conductive layers can comprise doped silicon carbide, or alternately thermally oxidized silicon carbide. The interconnect can be configured for use with a testing apparatus for testing discrete components such as dice or chip scale packages, or alternately for use with a testing apparatus for testing wafer sized components, such as wafers, panels and boards. In addition, the interconnect can be configured for constructing semiconductor packages and electronic assemblies such as multi chip modules.

35 Claims, 9 Drawing Sheets

U.S. PATENT DOCUMENTS

| | | | |
|---|---|---|---|
| 5,789,278 | A | 8/1998 | Akram et al. |
| 5,818,071 | A | 10/1998 | Loboda et al. |
| 5,869,974 | A | 2/1999 | Akram et al. |
| 5,877,516 | A | 3/1999 | Mermagen et al. |
| 5,911,864 | A | 6/1999 | Eldridge |
| 5,915,977 | A | 6/1999 | Hembree et al. |
| 5,931,685 | A | 8/1999 | Hembree et al. |
| 5,962,921 | A | 10/1999 | Farnworth et al. |
| 6,040,702 | A | 3/2000 | Hembree et al. |
| 6,060,891 | A | 5/2000 | Hembree et al. |
| 6,068,669 | A | 5/2000 | Farnworth et al. |
| 6,078,186 | A | 6/2000 | Hembree et al. |
| 6,091,250 | A | 7/2000 | Wood et al. |
| 6,091,251 | A | 7/2000 | Wood et al. |
| 6,091,252 | A | 7/2000 | Akram et al. |
| 6,094,058 | A | 7/2000 | Hembree et al. |
| 6,107,109 | A | 8/2000 | Akram et al. |
| 6,215,322 | B1 | 4/2001 | Farnworth et al. |
| 6,222,379 | B1 | 4/2001 | Farnworth et al. |
| 6,229,324 | B1 | 5/2001 | Akram et al. |
| 6,232,243 | B1 | 5/2001 | Farnworth et al. |
| 6,242,935 | B1 | 6/2001 | Akram |
| 6,255,833 | B1 | 7/2001 | Akram et al. |
| 6,258,609 | B1 | 7/2001 | Farnworth et al. |
| 6,259,036 | B1 | 7/2001 | Farnworth |
| 6,263,566 | B1 * | 7/2001 | Hembree et al. ............ 29/874 |
| 6,265,245 | B1 | 7/2001 | Farnworth et al. |
| 6,275,052 | B1 | 8/2001 | Hembree et al. |
| 6,278,286 | B1 | 8/2001 | Farnworth et al. |
| 6,285,202 | B1 | 9/2001 | Hembree |
| 6,285,203 | B1 | 9/2001 | Akram et al. |
| 6,294,837 | B1 | 9/2001 | Akram et al. |
| 6,297,653 | B1 | 10/2001 | Hembree |
| 6,297,660 | B2 | 10/2001 | Farnworth et al. |
| 6,300,782 | B1 | 10/2001 | Hembree et al. |
| 6,307,394 | B1 | 10/2001 | Farnworth et al. |
| 6,310,484 | B1 | 10/2001 | Akram et al. |
| 6,313,651 | B1 | 11/2001 | Hembree et al. |
| 6,314,641 | B1 | 11/2001 | Akram |
| 6,340,894 | B1 | 1/2002 | Farnworth et al. |
| 6,353,326 | B2 | 3/2002 | Hembree et al. |
| 6,359,456 | B1 | 3/2002 | Hembree et al. |
| 6,362,637 | B2 | 3/2002 | Farnworth et al. |
| 6,383,825 | B1 | 5/2002 | Farnworth et al. |
| 6,392,429 | B1 | 5/2002 | Hembree et al. |
| 6,400,174 | B2 | 6/2002 | Akram et al. |
| 6,414,506 | B2 | 7/2002 | Akram et al. |
| 6,563,215 | B1 * | 5/2003 | Akram et al. ............ 257/737 |

* cited by examiner

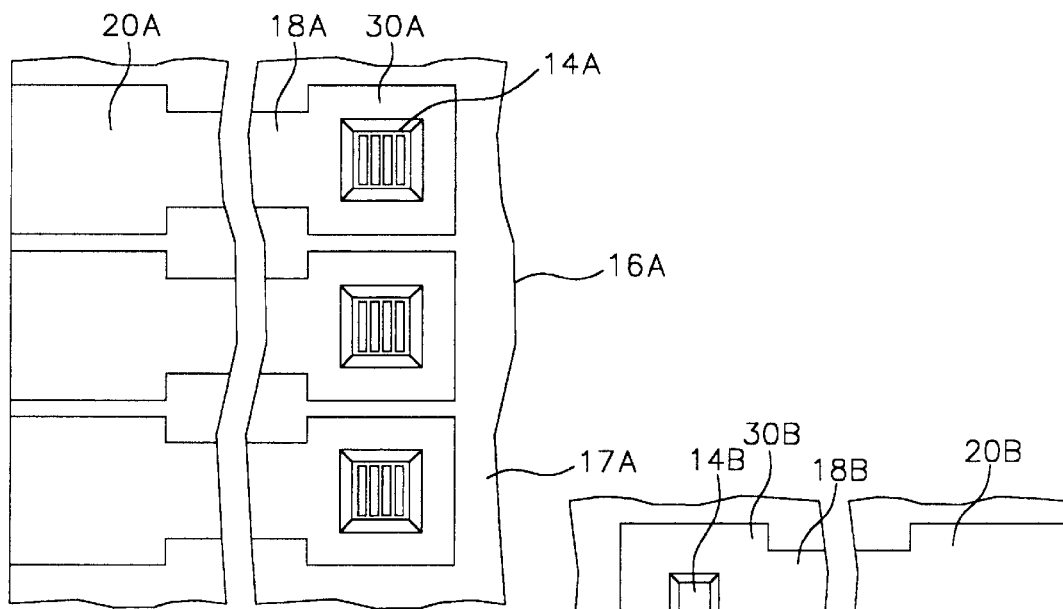
FIGURE 3A
FIGURE 3B
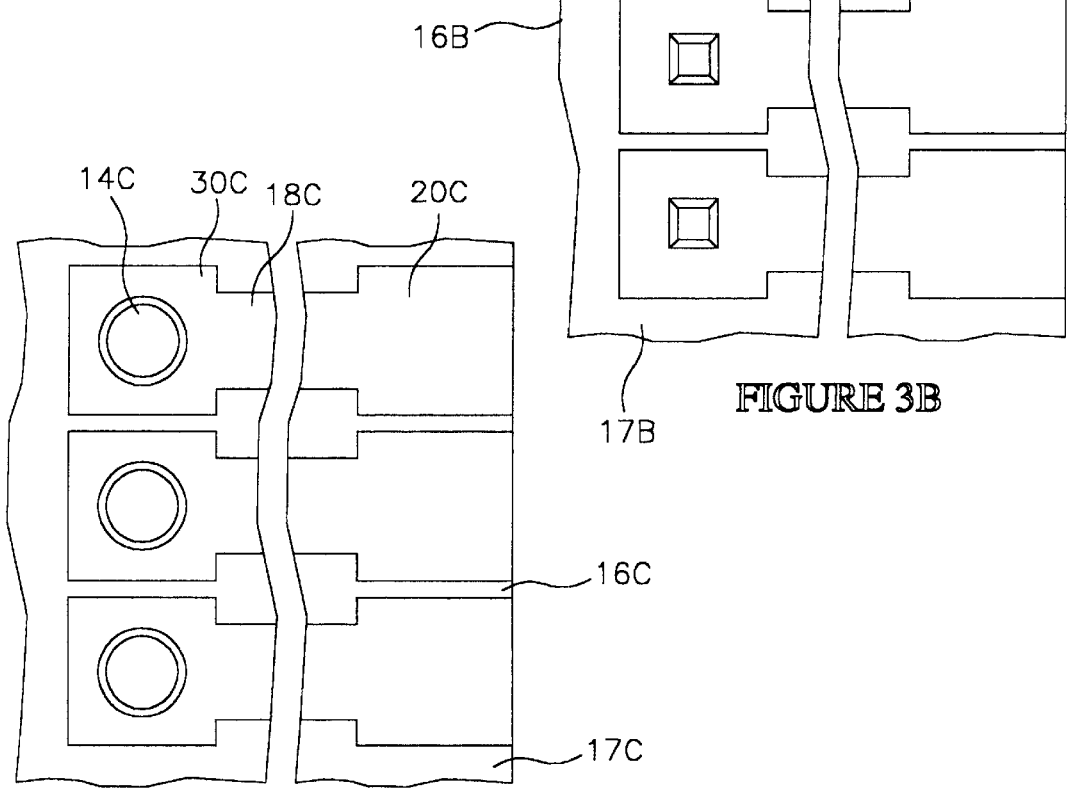
FIGURE 3C

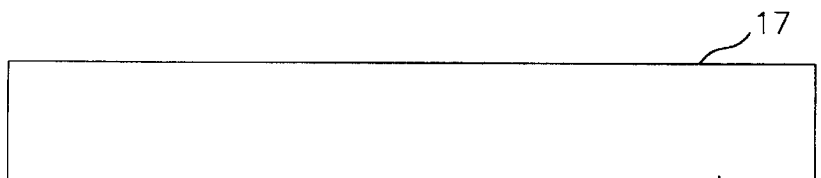
FIGURE 4A
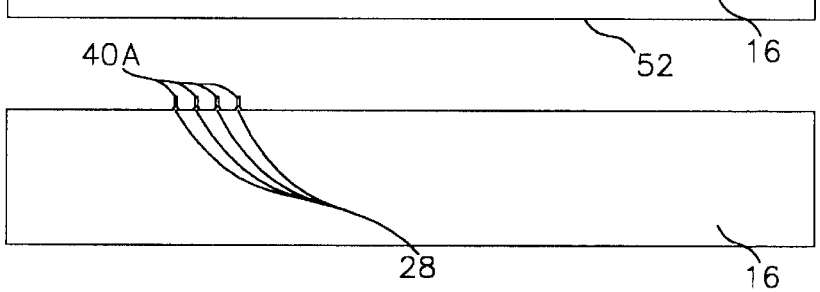
FIGURE 4B
FIGURE 4C
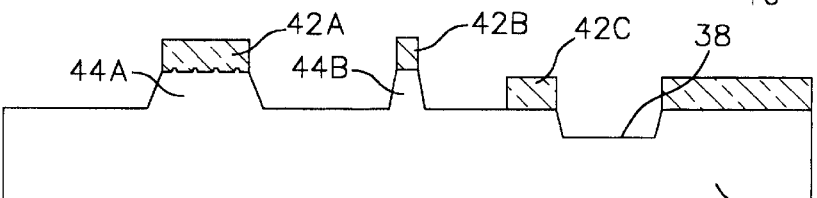
FIGURE 4D
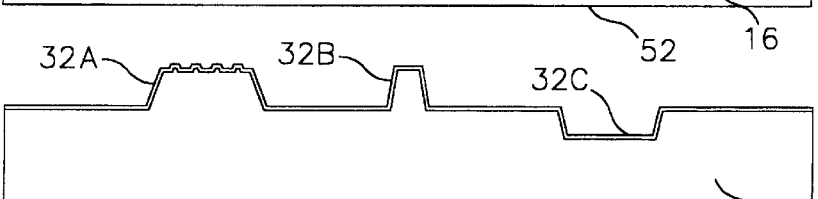
FIGURE 4E
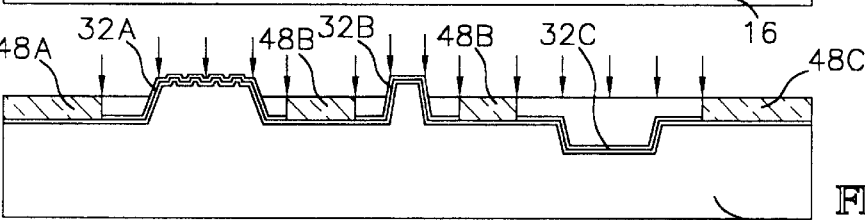
FIGURE 4F
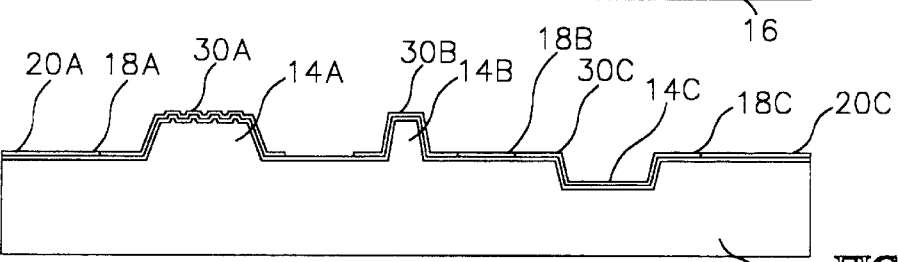
FIGURE 4G
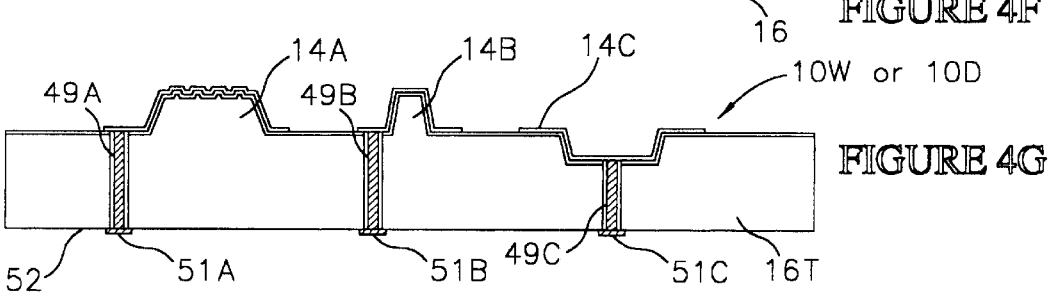

SILICON CARBIDE INTERCONNECT FOR SEMICONDUCTOR COMPONENTS

CROSS REFERENCE TO RELATED APPLICATIONS

This application is a continuation of Ser. No. 09/480,027 filed on Jan. 10, 2000, U.S. Pat. No. 6,563,215 B1.

This application is related to Ser. No. 10/187,915, filed on Jul. 1, 2002.

FIELD OF THE INVENTION

This invention relates generally to semiconductor manufacture and specifically to an improved interconnect for electrically engaging semiconductor components such as dice, packages, wafers, panels, boards, and electronic assemblies containing dice or packages.

BACKGROUND OF THE INVENTION

Different types of semiconductor components include terminal contacts which provide electrical connection points for applying electronic signals to the integrated circuits contained on the components. For example, bare dice and semiconductor wafers typically include bond pads which function as terminal contacts. Chip scale packages typically include solder balls, which function as terminal contacts. Electronic assemblies, such as circuit boards and field emission displays, can include pads, solder balls or pins which function as terminal contacts.

Typically, an interconnect must be provided for making electrical connections to the terminal contacts on the contacts. For example, semiconductor test systems include an interconnect that makes temporary electrical connections with the terminal contacts on the components. Depending on the system, the interconnect can be die sized, or wafer sized. U.S. Pat. No. 5,686,317 entitled "Method For Forming An Interconnect Having A Penetration Limited Contact Structure For Establishing A Temporary Electrical Connection With A Semiconductor Die", describes a die level interconnect configured for use with a carrier. U.S. Pat. No. 5,869,974 entitled "Micromachined Probe Card Having Compliant Contact Members For Testing Semiconductor Wafers", describes a wafer level interconnect configured for use with a wafer prober.

Interconnects are also used to provide permanent electrical connections to a semiconductor component for various electronic assemblies. For example, U.S. Pat. No. 5,578,526 entitled "Method For Forming A Multi Chip Module", and U.S. Pat. No. 5,789,278 entitled "Method For Fabricating Chip Modules", describe multi chip modules having interconnects which form permanent electrical connections to the terminal contacts on components.

One material that can be used to fabricate interconnects is silicon. Silicon can be used as a substrate material, and also to form contacts for the interconnect. With silicon, a coefficient of thermal expansion (CTE) of the interconnect matches the CTE of the component. In test systems, the matching CTEs minimize thermal stresses during test procedures, such as burn-in, which are conducted at elevated temperatures. In electronic assemblies, the matching CTEs minimize thermal stresses due to heat generated by the semiconductor component, or by the operating environment.

One aspect of silicon is that it is a semiconductor material, and does not have sufficient electrical conductivity to permit signal transmission. Accordingly, the silicon must be coated with electrically conductive materials to form contacts, conductive traces and bond pads for the interconnect. The conductive materials can include metals, such as copper and aluminum, or metal silicides, such as $TiSi_2$.

Some of the conductive materials used in interconnects do not possess sufficient strength to resist deformation during fabrication or use of electronic assemblies. For example, in test systems, some conductive materials, such as metals, are prone to wear and oxidation with continued usage. Also, some conductive materials, such as metal silicides, do not possess a thermal conductivity which permits efficient heat dissipation from the component.

SUMMARY OF THE INVENTION

In accordance with the present invention, an improved interconnect for semiconductor components, and a method for fabricating the interconnect are provided. The interconnect comprises a substrate, and a pattern of interconnect contacts on the substrate configured to electrically engage component contacts on the components.

In an illustrative embodiment, the substrate comprises silicon, and the interconnect contacts comprise silicon projections, or alternately indentations in the substrate, at least partially covered with silicon carbide (SiC) layers. The interconnect also includes a pattern of conductors (conductive traces) in electrical communication with the silicon carbide layers, and a pattern of terminal contacts, such as bonding pads, in electrical communication with the silicon carbide layers. The conductors provide electrical paths for signal transmission to and from the interconnect contacts. The terminal contacts provide an electrical connections points for external circuitry, such as test circuitry to the interconnect.

As silicon carbide has a mechanical hardness similar to diamond, the silicon carbide layers provide a wear-resistant surface for the interconnect contacts. The wear resistant surface makes the interconnect particularly suitable to testing applications wherein the interconnect contacts are used to perform multiple test procedures on many different components. The silicon carbide layer also has a relatively high strength and a high maximum working temperature, such that the interconnect contacts can resist deformation at temperature.

In addition, as silicon carbide has a high thermal conductivity, the silicon carbide layers provide efficient heat transfer from the component contacts to the interconnect contacts, and better temperature control at the interface of the interconnect contacts with the component contacts. Further, the silicon carbide layers can be configured to substantially cover the area on the substrate between the interconnect contacts to provide a large surface area for dissipating heat generated by the component.

Although silicon carbide has a relatively low electrical conductivity, a sufficient electrical conductivity can be provided by doping a silicon carbide layer with selected dopants having either a P-type, or a N-type conductivity. Doping can be accomplished during CVD deposition of silicon carbide, or following deposition by implanting the dopants (e.g., ion implantation) and then annealing to activate the dopant. Electrical conductivity can also be provided by oxidation of the silicon carbide conductive layers using localized thermal heating. One method for performing the localized thermal heating is with a focused laser beam. Using a doping or oxidation process, the interconnect contacts can have an electrical conductivity similar to contacts covered with a metal.

Preferably, the conductors on the interconnect are fabricated from a highly conductive metal, such as aluminum or copper, to provide low resistance signal paths for the interconnect contacts. In addition, conductive vias and backside contacts can be formed on the substrate in electrical contact with the conductors, or directly with the silicon carbide conductive layers.

Alternately, rather than forming the conductors of a separate metal, a blanket deposited silicon carbide layer can be patterned to provide the silicon carbide conductive layers, as well as the conductors for the interconnect contacts. In this case a circuit side surface of the interconnect is substantially covered with silicon carbide, such that the interconnect possesses improved heat dissipation characteristics. As another alternative, a blanket deposited silicon carbide layer can be selectively doped to form the silicon carbide conductive layers, and a separate metallization process can be used to form conductors on the blanket deposited silicon carbide layer.

The interconnect can be configured for die level testing of discrete components, such as bare dice or chip scale packages, or alternately for wafer level testing of multiple components contained on a common substrate, such as a wafer, a panel, a circuit board, or an electronic assembly. In addition, the interconnect contacts can be configured to electrically engage either planar component contacts (e.g., bond pads, test pads, land pads), or bumped component contacts (e.g., solder balls, metal bumps, conductive polymer bumps). For engaging planar component contacts, the interconnect contacts can comprise etched members with projections for penetrating the component contacts to a limited penetration depth. For engaging bumped component contacts, the interconnect contacts can comprise projections configured to penetrate the bumped component contacts, or alternately recesses sized and shaped to retain the bumped component contacts.

For a die level test system, the interconnect is configured for assembly in a testing apparatus, such as a carrier, configured to retain one or more components in electrical communication with testing circuitry. The testing apparatus includes a base on which the interconnect is mounted, and a force applying mechanism for biasing the components against the interconnect. For a wafer level test system, the interconnect is configured for use with a wafer testing apparatus such as a wafer prober. In the wafer level test system the interconnect can take the place of a conventional probe card.

The interconnect can also be configured to make permanent electrical connections with components for constructing electronic assemblies, semiconductor packages, and multi chip modules.

The method for fabricating the interconnect, broadly stated, includes the steps of: providing a substrate, forming interconnect contacts on the substrate, forming an insulating layer on the substrate and on the interconnect contacts, forming silicon carbide conductive layers on the interconnect contacts and on select portions of the substrate, and then forming conductors and terminal contacts in electrical communication with the silicon carbide conductive layers.

The silicon carbide conductive layers can be deposited on the interconnect contacts by chemical vapor deposition through a mask, or by conformal deposition of a layer of silicon carbide on the substrate followed by etching. Also, the silicon carbide conductive layers can be doped during deposition, or implanted following deposition. Alternately, the "as deposited" silicon carbide conductive layers can be subjected to localized heat with a laser beam to improve the electrical conductivity of the interconnect contacts. A silicon carbide layer can also be deposited, or patterned, to form the conductors and the terminal contacts as well as a large area heat transfer surface on the interconnect.

BRIEF DESCRIPTION OF THE DRAWINGS

FIG. 3A is a plan view taken along line 3A—3A of FIG. 2A illustrating a layout of the first interconnect contacts;

FIG. 3B is a plan view taken along line 3B—3B of FIG. 2B illustrating a layout of the second interconnect contacts;

FIG. 3C is a plan view taken along line 3C—3C of FIG. 2C illustrating a layout of the third interconnect contacts;

FIGS. 4A–4F are schematic cross sectional views illustrating process steps for fabricating an interconnect in accordance with the invention;

FIG. 4G is a schematic cross sectional view illustrating an optional process step wherein conductive vias and backside contacts are formed on the interconnect;

DETAILED DESCRIPTION OF THE PREFERRED EMBODIMENTS

As used herein, the term "semiconductor component" refers to an electrical element or assembly that contains a semiconductor die. Exemplary semiconductor components include bare semiconductor dice, chip scale packages, conventional semiconductor packages, wafers containing dice or chip scale packages, panels containing chip scale packages, boards containing semiconductor dice, and electronic assemblies, such as field emission displays, containing semiconductor dice.

Figure 1A:
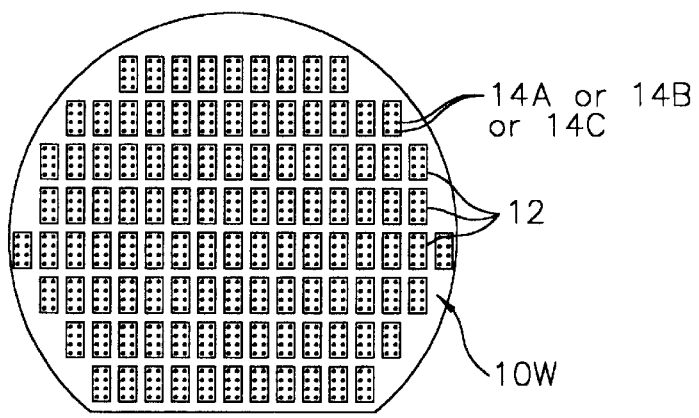
FIG. 1A is a schematic plan view of a wafer level interconnect constructed in accordance with the invention.

In FIG. 1A, a wafer level interconnect low is illustrated. The interconnect 10W is adapted to electrically engage wafer sized components such as semiconductor wafers. In the illustrative embodiment, the interconnect 10W has the peripheral shape of a semiconductor wafer. However, depending on the components being electrically engaged, other peripheral shapes are possible. In addition, the interconnect 10W includes a plurality of contact sites 12 corresponding to the location of the dice on the wafer. Again, the number and configuration of the contact sites 12 will correspond to the components being electrically engaged.

Figure 1B:
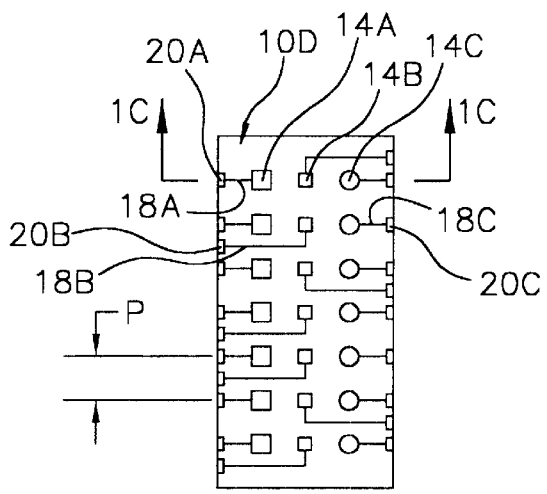
FIG. 1B is a schematic plan view of a die level interconnect constructed in accordance with the invention.

In FIG. 1B, a die level interconnect 10D is illustrated. The die level interconnect 10D is adapted to electrically engage discrete semiconductor components, such as singulated semiconductor dice, or chip scale packages. The die level interconnect 10D, and the wafer level interconnect 10W have the same basic construction, but different peripheral sizes and peripheral configurations. In general, each contact site 12 on the wafer level interconnect 10W corresponds in size and shape to the die level interconnect 10D.

As shown in FIG. 1B, the interconnect 10D (or the interconnect 10W) includes a plurality of interconnect contacts 14A, 14B, 14C. For illustrative purposes, three different types of interconnect contacts 14A, 14B, 14C are shown on the interconnect 10D. However, in actual practice the interconnect 10D (or the interconnect 10W) will include only one type of interconnect contact 14A, 14B, 14C.

The interconnect 10D (or the interconnect 10W) also includes conductors 18A, 18B, 18C in electrical communication with the interconnect contacts 14A, 14B, 14C. In addition, the interconnect 10D (or the interconnect 10W) includes terminal contacts in the form of bonding pads 20A, 20B, 20C in electrical communication with the interconnect contacts 14A, 14B, 14C.

Figure 1C:
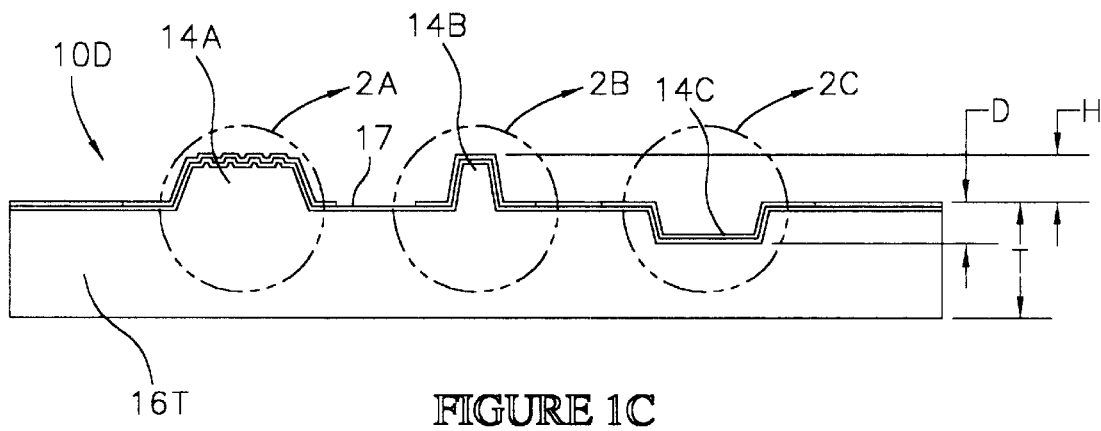
FIG. 1C is an enlarged schematic cross sectional view taken along section line 1C—1C of FIG. 1B.

As shown in FIG. 1C, the interconnect 10D (or the interconnect 10W) includes a substrate 16 having a circuit side surface 17. The interconnect contacts 14A, 14B, 14C, the conductors 18A, 18B, 18C, and the bonding pads 20A, 20B, 20C are formed on the circuit side surface 17 of the substrate 16.

As also shown in FIG. 1C, the interconnect contacts 14A, 14B have a height of H, and the interconnect contacts 14C have a depth of D relative to the surface 17. By way of example and not limitation, the height H of the contacts 14A, 14B can be about 50 μm (0.050 mm) to 100 μm (0.10 mm). A depth D of the contacts 14C can be about 25 μm (0.025 mm) to 100 μm (0.10 mm). A pitch P (FIG. 1B) of the contacts 14A, 14B, 14C will exactly match a pitch of the contacts on the component. A representative pitch P (center to center spacing) of the contacts 14A, 14B, 14C can be from about 0.008 inches (0.228 mm) to about 0.060 inches (1.524 mm) or greater.

Figure 2A:
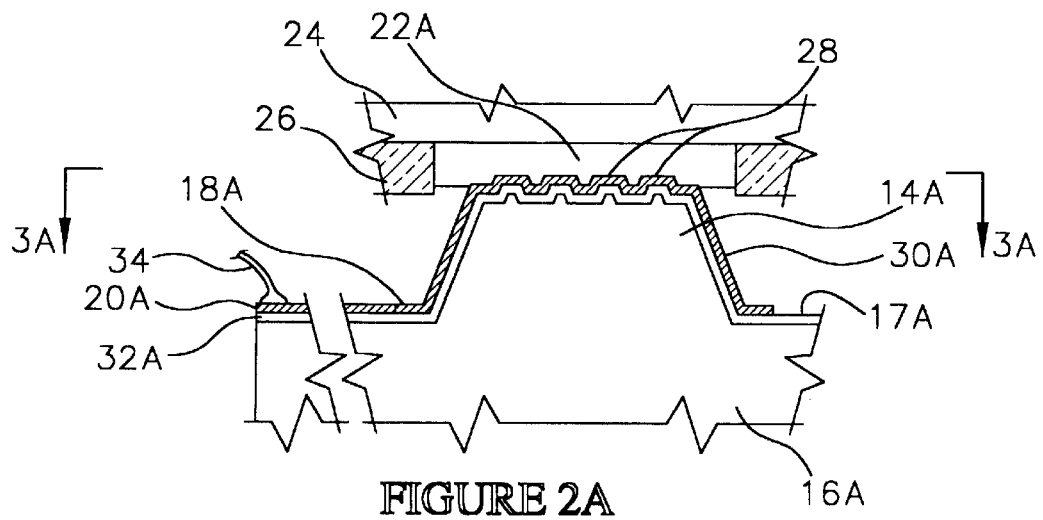
FIG. 2A is an enlarged cross sectional view taken along section line 2A of FIG. 1C illustrating a first interconnect contact electrically engaging a planar component contact.

Referring to FIG. 2A, the interconnect contact 14A is shown electrically engaging a planar contact 22A on a component 24. The planar contact 22A comprises a thin film bond pad formed of a material such as aluminum, embedded in a passivation layer 26, such as BPSG. Alternately, the interconnect contacts 14A can be configured to electrically engage other types of planar contacts, such as test pads, or land pads. Additionally, the interconnect contacts 14A can be configured to electrically engage thick film contacts rather than thin film contacts.

In the illustrative embodiment, the substrate 16 comprises silicon, and the interconnect contacts 14A comprise etched projections formed integrally with the substrate 16 using a fabrication process to be hereinafter described. With the substrate comprising silicon, a coefficient of thermal expansion (CTE) of the substrate 16 substantially matches that of semiconductor components such as bare dice and wafers. However, the substrate 16 can also comprise ceramic, plastic, silicon-on-glass, silicon-on-sapphire, or another semiconductor material such as gallium arsenide or germanium.

The interconnect contacts 14A are formed in a pattern that matches a pattern of the planar contacts 22A on the component 24. In addition, the interconnect contacts 14A include penetrating projections 28 adapted to penetrate the planar contacts 22A to a limited penetration depth. With the planar contacts 22A comprising thin film bond pads, the penetration depth will be less than about 1 μm. Accordingly, the penetrating projections 28 can be formed with a height of less than about 1 μm.

As also shown in FIG. 2A, the interconnect contacts 14A include silicon carbide conductive layers 30A in electrical communication with the conductors 18A, and with the bonding pads 20A on a surface 17A of the substrate 16A. The silicon carbide conductive layers 30A electrically engage the planar contacts 22A on the component 24 to provide conductive paths for applying test signals to the integrated circuits contained on the component 24.

Still referring to FIG. 2A, the substrate 16A also includes an insulating layer 32A adapted to electrically insulate the silicon carbide conductive layers 30A and the conductors 18A from a bulk of the substrate 16A. The insulating layer 32A can comprise a grown or deposited oxide such as $SiO_2$, or a polymer, such as polyimide. If the substrate 16A comprises an electrically insulating material such as ceramic, the insulating layer 32A is not required.

As also shown in FIG. 2A, the bonding pads 20A provide bonding sites for wire bonding bond wires 34. The bond wires 34 provide separate electrical paths from test circuitry and a test apparatus to be hereinafter described. Alternately, the bonding pads 20A can be configured for bonding to TAB tape, or as contact sites for engagement by electrical connectors of the test apparatus. Further, the bonding pads 20A can be configured for electrical communication with conductive vias formed within the substrate 16A. Alternately rather than bonding pads 20A, the interconnect can include other types of terminal contacts such as balls, pins or leads.

Suitable methods for etching the substrate 16A to form the interconnect contacts 14A are described in U.S. Pat. No. 5,483,741, entitled "Method For Fabricating A Self Limiting Silicon Based Interconnect For Testing Bare Semiconductor Dice", and in U.S. Pat. No. 5,686,317 entitled "Method For Forming An Interconnect Having A Penetration Limited Contact Structure For Establishing A Temporary Electrical Connection With A Semiconductor Die" which are incorporated herein by reference.

The silicon carbide conductive layers 30A, can comprise a layer of silicon carbide that is patterned to cover the interconnect contacts 14A and select portions of the substrate 16A proximate to the interconnect contacts 14A. As will be further explained, the layer of silicon carbide can be chemically vapor deposited through a mask in a required pattern on the surface 17A of the substrate 16A. Alternately, the layer of silicon carbide can be conformally deposited on the surface 17A of the substrate 16A and then etched to cover the interconnect contacts 14A. In either case, the silicon carbide conductive layers 30A can be either doped, or oxidized using localized thermal heating to increase the electrical conductivity of the layers 30A.

The conductors 18A and the bonding pads 20A can comprise a different material than the silicon carbide conductive layers 30A, such as a separately deposited and patterned highly conductive metal layer. Suitable materials include aluminum, chromium, titanium, nickel, iridium, copper, gold, tungsten, silver, platinum, palladium, tantalum, molybdenum or alloys of these metals such as $TiSi_2$. Alternately, the conductors 18A and the bonding pads 20A can comprise a same layer of silicon carbide as is used to form the silicon carbide conductive layers 30A.

Figure 2B:
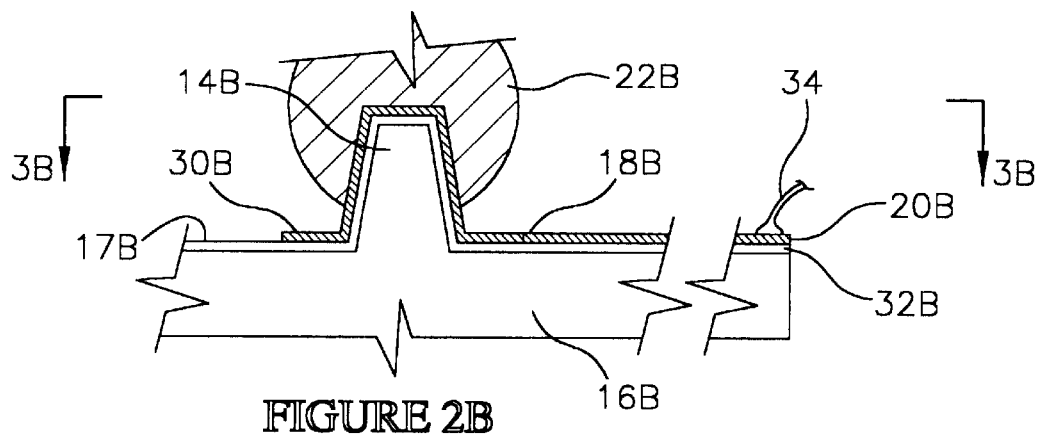
FIG. 2B is an enlarged cross sectional view taken along section line 2B of FIG. 1C illustrating a second interconnect contact electrically engaging a bumped component contact.

Referring to FIG. 2B, the interconnect contact 14B is shown electrically engaging a bumped contact 22B on the component. The bumped contact 22B comprises a solder ball, as is found on bumped dice and wafers, ball grid array packages, chip scale packages and other bumped components. Alternately, the bumped contact 22B can have a hemispherical, bumped, or dome shape as is conventional. In addition, rather than solder the bumped contact 22B can comprise another metal, or a conductive polymer material. The interconnect contact 14B is adapted to penetrate into the bumped contact 22B and to contact the underlying metal. This allows native oxide layers to be penetrated for making low resistance electrical connections.

The interconnect contact 14B comprises a projection on a surface 17B of a substrate 16B which can be formed using an etching process to be hereinafter described. As with the interconnect contacts 14A, the interconnect contacts 14B, and portions of the substrate 16B proximate to the contacts 14B, are at least partially covered with silicon carbide conductive layers 30B. The silicon carbide conductive layers 30B are in electrical communication with conductors 18B and bonding pads 20B on the surface 17B of the substrate 16B. In addition, an electrically insulating layer 32B electrically insulates the silicon carbide conductive layers 30B and the conductors 18B from the substrate 16B. As with the previous embodiment, the silicon carbide conductive layers 30B, the conductors 18B and the bonding pads 20B can comprise different materials, or a same patterned layer of silicon carbide.

Figure 2C:
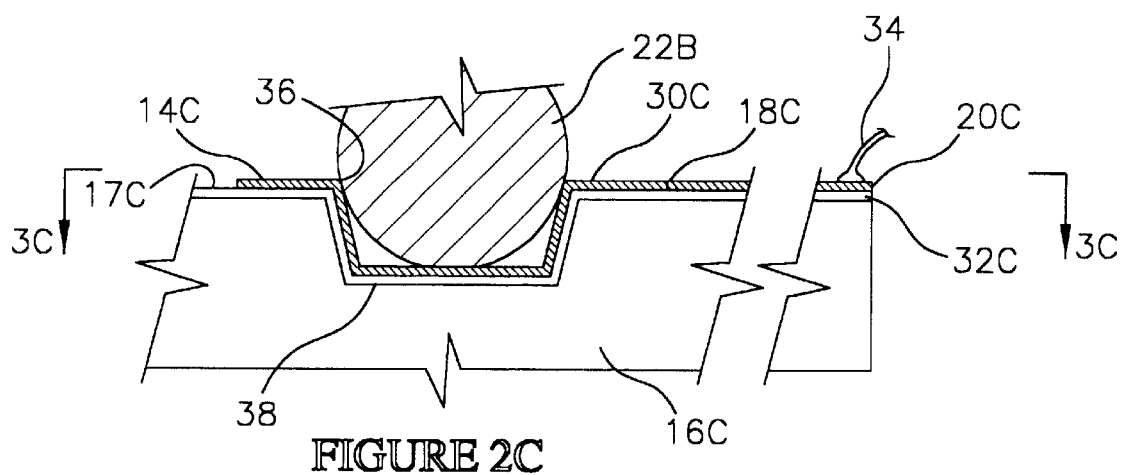
FIG. 2C is an enlarged cross sectional view taken along section line 2C of FIG. 1C illustrating a third interconnect contact electrically engaging a bumped component contact.

Referring to FIG. 2C, the interconnect contact 14C is shown electrically engaging the bumped contact 22B. The interconnect contact 14C comprises a recess 38 formed in a surface 17C of a substrate 16C, that is sized and shaped to retain the bumped contact 22B. The interconnect contact 14C also includes a silicon carbide conductive layer 30C at least partially covering the recess 38 and select portions of the substrate 16C proximate to the recess 38. The silicon carbide conductive layer 30C is in electrical communication with a conductor 18C, and with a bonding pad 18C on the surface 17C of the substrate 16C. Peripheral edges 36 of the silicon carbide conductive layer 30C are adapted to penetrate the bumped contact 22B to pierce native oxide layers and contact the underlying metal.

As with the previous embodiments, the silicon carbide conductive layers 30C, the conductors 18C and the bonding pads 20C can comprise different layers of material, or a same layer of silicon carbide formed using a process to be hereinafter described. Also with the substrate 16C comprising silicon, an electrically insulating layer 32C can be formed on the surface 17C of the substrate 16C to provide electrical insulation for the silicon carbide conductive layers 30C, the conductors 18C and the bonding pads 20C, as previously described.

The recesses 38 for the contacts 14C can be etched into the surface 17C by forming a mask (not shown) on the substrate 16C, such as a photo patterned resist mask, and then etching the substrate 16C through openings in the mask, using an etchant. With the substrate 16C comprising silicon, a suitable etchant for performing the etch process comprises a solution of KOH.

A size and shape of the recesses 38 will be determined by the openings in the etch mask used to etch the substrate 16C. Each recess 38 is sized and shaped to retain and electrically engage a single bumped contact 22B. A representative diameter, or width, of the recesses 38 can be from 0.002 inches (0.051 mm) to 0.050 inches (1.27 mm) or more. This diameter can be less than a diameter of the bumped contacts 22B so that only portions thereof will be contacted. A depth of the recesses 38 can be equal to or less than the diameter thereof. A pitch or spacing of the recesses 38 will exactly match a pitch of the bumped contacts 22B.

Referring to FIG. 3A, a layout of the interconnect contacts 14A, the silicon carbide conductive layers 30A, the conductors 18A, and the bonding pads 20A is illustrated. The silicon carbide conductive layers 30A are configured to completely cover the interconnect contacts 14A. In addition, the silicon carbide conductive layers 30A surround the interconnect contacts 14A, and substantially cover the area on the surface 17A of the substrate 16A between adjacent interconnect contacts 14A. This geometry provides an increased surface area for heat dissipation from the interconnect 10D, and takes advantage of the high thermal conductivity of the silicon carbide conductive layers 30A. In addition, the high thermal conductivity of the silicon carbide conductive layers 30A allow the interconnect contacts 14A, and the component contacts 22A (FIG. 2A) to quickly reach thermal equilibrium, and to have substantially the same temperature. This helps to control the temperature at the interface of the interconnect contacts 14A and the component contacts 22A (FIG. 2A) such that large temperature gradients do not occur.

As also shown in FIG. 3A, if desired, the conductors 18A and the bonding pads 20A can be configured to substantially cover the surface 17A of the substrate 16A. This geometry provides an increased surface area for dissipating heat generated by the semiconductor component 24 (FIG. 2A). Heat transfer is further enhanced if the conductors 18A and the bonding pads 20A are formed of silicon carbide. By way of example and not limitation, a representative percentage of the surface area occupied by the silicon carbide conductive layers 30A, the conductors 18A, and the bonding pads 20B can be from 50% to 90% of the total surface area of the surface 17A.

Referring to FIG. 3B, a layout of the interconnect contacts 14B, the silicon carbide conductive layers 30B, the conductors 18B, and the bonding pads 20B is illustrated. The silicon carbide conductive layers 30B are configured to completely cover the interconnect contacts 14B. In addition, the silicon carbide conductive layers 30B surround the interconnect contacts 14B, and substantially cover the area on the surface 17B of the substrate 16B between adjacent interconnect contacts 14B. Further, the conductors 18B and the bonding pads 20B can be configured to substantially cover the surface 17B of the substrate 16B.

Referring to FIG. 3C, a layout of the interconnect contacts 14C, the silicon carbide conductive layers 30C, the conductors 18C, and the bonding pads 20C is illustrated. The silicon carbide conductive layers 30C are configured to completely cover the interconnect contacts 14C. In addition, the silicon carbide conductive layers 30C surround the interconnect contacts 14C and substantially cover the area on the surface 17C of the substrate 16C between adjacent interconnect contacts 14C. Further, the conductors 18C and the bonding pads 20C can be configured to substantially cover the surface 17C of the substrate 16C.

Referring to FIGS. 4A–4G, steps in a method for fabricating the interconnect 10W (FIG. 1A) or the interconnect 10D (FIG. 1B) are illustrated. In FIGS. 4A–4G, the different interconnect contacts 14A, 14B, 14C are illustrated as being formed at the same time on the substrate 16. However, in actual practice only one type of contact 14A, 14B, 14C will be formed on an interconnect 10W or 10D.

Initially as shown in FIG. 4A, the substrate 16 can be provided. The substrate 16 includes the circuit side surface 17 and a backside surface 52. Preferably the substrate 16 comprises a wafer of material such that a wafer level fabrication process can be employed to make either interconnect 10W or interconnect 10D. In the case of the wafer level interconnect 10W (FIG. 1A), the substrate 16 can be the same size and peripheral configuration as the completed interconnect 10W. In the case of the die level interconnect 10D (FIG. 1B), a singulation process, such as cutting or shearing, can be used to separate multiple interconnects 10D from the substrate 16. The separated interconnects 10D (FIG. 1B) will then have a peripheral shape corresponding to the component being tested. In the illustrative embodiment the substrate 16 comprises monocrystalline silicon. A thickness of the substrate 16 can be that of a conventional silicon wafer blank. A representative thickness T (FIG. 1C) of the substrate 16 can be about 0.028 inches (0.712 mm) or greater. A representative diameter of the substrate 16 can be about 200 mm.

Next, as shown in FIG. 4B, an etch mask 40A can be formed on the substrate 16, and used to etch the penetrating projections 28 for contact 14A. The etch mask 40A can comprise resist, or a hard mask such as $Si_3N_4$. In addition, a wet etchant, such as KOH, can be used to etch the substrate 16 through openings in the etch mask 40A to form the penetrating projections 28. A representative height of the penetrating projections can be from 0.25 $\mu$m to 1.0 $\mu$m.

Next, as shown in FIG. 4C, an etch mask 42A can be formed on the substrate 16 for etching a projection 44A for contact 14A. A representative height of the projection 44A can be about 25 $\mu$m to 100 $\mu$m, and a representative width can be about 25 $\mu$m to 50 $\mu$m on a side. Similarly, an etch mask 42B can be formed on the substrate 16 for etching a projection 44B for contact 14B. The projection 44B can be sized similarly to projection 44A. Similarly, an etch mask 42C can be formed on the substrate 16 for etching the recess 38 for contact 14C. The recess 38 can be sized as previously described. The masks 42A, 42B, 42C can comprise hard masks or resist masks. In addition, a wet etchant such a KOH can be employed to anisotropically etch the substrate 16 through openings in the masks 42A, 42B, 42C. Alternately an isotropic etch process with a wet etchant such as $HF/HNO_3$ can be employed.

Next, as shown in FIG. 4D, the insulating layers 32A, 32B, 32C can be formed. The insulating layers 32A, 32B, 32C can comprise an electrically insulating material, such as $SiO_2$, or $Si_3N_4$, deposited to a desired thickness using CVD, or other deposition process. A $SiO_2$ layer can also be grown on exposed surfaces of the substrate 16 using an oxidizing atmosphere such as steam and $O_2$ at an elevated temperature (e.g., 950° C.). The insulating layers 32A, 32B, 32C can also comprise a polymer, such as polyimide, deposited and planarized using a suitable process (e.g., spin-on-process). Depending on the material, a representative thickness of the insulating layers 32A, 32B, 32C can be from about a 100 Å to several mils.

Next, as shown in FIG. 4E, a deposition mask 48A, 48B, 48C can be formed on the substrate 16. The deposition mask 48A, 48B, 48C preferably comprises a hard mask, such as $Si_3N_4$, deposited to a desired thickness then etched through a resist mask (not shown) in a required pattern. In the illustrative embodiment, the deposition mask 48A, 48B, 48C defines the pattern for the silicon carbide conductive layers 30A, 30B, 30C, the conductors 18A, 18B, 18C, and the bonding pads 20A, 20B, 20C. Alternately, the deposition mask 48A, 48B, 48C can define just the pattern for the conductive layers 30A, 30B, 30C. In this case the conductors 18A, 18B, 18C and bonding pads 20A, 20B, 20C can be formed separately from the conductive layers 30A, 30B, 30C of a different metal using a suitable metallization process (e.g., deposition, photopatterning, etching).

Using the deposition mask 48A, 48B, 48C a silicon carbide (SiC) layer can be deposited through openings in the mask 48A, 48B, 48C to form the silicon carbide conductive layers 30A, 30B, 30C, the conductors 18A, 18B, 18C, and the bonding pads 20A, 20B, 20C. The arrows in FIG. 4E represent deposition of the silicon carbide conductive layers 30A, 30B, 30C. By way of example, a thickness of the silicon carbide layer 30A, 30B, 30C, the conductors 18A, 18B, 18C, and the bonding pads 20A, 20B, 20C, can be from 2000 Å to 10,000 Å or greater.

A preferred method for depositing silicon carbide to form the silicon carbide conductive layers 30A, 30B, 30C, the conductors 18A, 18B, 18C, and the bonding pads 20A, 20B, 20C. is chemical vapor deposition (CVD). Conventional processes for chemical vapor deposition of silicon carbide are known in the art. The silicon carbide can be deposited in a single step or in multiple steps to achieve a desired thickness. In general, the CVD process comprises heating the substrate 16 to a suitable temperature in a CVD reactor as a gas, or combination of gases, containing silicon and carbon atoms are introduced and reacted to form a silicon carbide layer. One suitable silicon containing gas comprises methyltrichlorosilane which undergoes pyrolysis at a temperature of about 1200° C. to 1300° C.

Also during the CVD process, a dopant gas species can be introduced into the process chamber, such that the silicon carbide layers 30A, 30B, 30C, the conductors 18A, 18B, 18C, and the bonding pads 20A, 20B, 20C contain a dopant for increased electrical conductivity. The dopant can comprise a P-type dopant such as B, Al, Ga In or Tl. Alternately the dopant can comprise a N-type dopant such as P. As, Sb or Bi. A representative dopant concentration can be from about $1 \times 10^{15}$ atoms/cm$^3$ to $1 \times 10^{21}$ atoms/cm$^3$.

As shown in FIG. 4F, following deposition of the silicon carbide conductive layers 30A, 30B, 30C, the conductors 18A, 18B, 18C, and the bonding pads 20A, 20B, 20C, the deposition masks 48A, 48B, 48C can be stripped using a suitable solution such as $H_3PO_4$ for a $Si_3N_4$ deposition mask 48A, 48B, 48C.

If doping is not performed during the CVD process an ion implantation process can be performed on the silicon carbide conductive layers 30A, 30B, 30C, the conductors 18A, 18B, 18C, and the bonding pads 20A, 20B, 20C to increase the electrical conductivity thereof. In this case an annealing step can be also be performed to activate the dopant. Ion implantation and annealing can be performed using equipment and techniques that are known in the art.

As another alternative, following formation of the silicon carbide conductive layers 30A, 30B, 30C, the conductors 18A, 18B, 18C, and the bonding pads 20A, 20B, 20C, an oxidation process using localized thermal heating with a laser can be performed to increase the conductivity of the silicon carbide material. If the conductors 18A, 18B, 18C and the bonding pads 20A, 20B, 20C are not formed of silicon carbide, then the oxidation process only needs to be performed on the silicon carbide conductive layers 30A, 30B, 30C.

A suitable process for performing the thermal oxidation process is described in U.S. Pat. No. 5,145,741 to Quick, which is incorporated herein by reference. Briefly, the thermal oxidation process involves focusing a laser beam produced by a Nd:YAG laser on the silicon carbide material to produce localized heating. This localized heating converts the silicon carbide to an electroconductive ternary ceramic compound. Using such a process the oxidized silicon carbide has a resistivity of about $10^{-4}$ ohm-cm at 21° C. This compares to the resistivity of an as deposited, non-doped silicon carbide which is about $10^{11}$ ohm-cm. If only the silicon carbide conductive layers 30A, 30B, 30C require oxidation, the substrate 16 can be held stationary and the laser beam focused on the individual interconnect contacts 14A, 14B, 14C.

Referring to FIG. 4G, as an optional step, additional process steps can be performed on the substrate 16, to form conductive vias 49A, 49B, 49C and backside contacts 51A, 51B, 51C. The backside contacts 51A, 51B, 51C take the place of the bonding pads 20A, 20B, 20C and allow electrical connections to be made to the backside surface 52 of the interconnect.

The conductive vias 49A, 49B, 49C comprise openings filled with a conductive material in electrical communication with the silicon carbide conductive layers 30A, 30B, 30C, or with the conductors 18A, 18B, 18C on the circuit side surface 17 of the substrate 16. One method for forming the openings for the conductive vias 49A, 49B, 49C is with a laser machining process. A suitable laser machining apparatus is manufactured by General Scanning of Sommerville, Mass. and is designated a Model No. 670-W. Another suitable laser machining apparatus is manufactured by Synova S.A., Lausanne, Switzerland. To complete the conductive vias 49A, 49B, 49C, a metal can be deposited within the openings using a deposition process, such as CVD, electrolytic deposition or electroless deposition. Alternately, rather than being a metal, the conductive material for the conductive vias 49A, 49B, 49C can comprise a conductive polymer, such as a metal filled silicone, a carbon filled ink, or an isotropic or anisotropic adhesive.

At the same time the conductive material is deposited in the openings to form the conductive vias 49A, 49B, 49C the backside contacts 51A, 51B, 51C can be formed on the backside surface 52 of the substrate 16. A suitable mask (not shown) can be used during deposition of the conductive material to form the backside contacts 51A, 51B, 51C with a desired thickness and peripheral shape. Alternately, the backside contacts 51A, 51B, 51C can comprise a different material than the conductive vias 49A, 49B, 49C formed using a separate deposition or metallization process. For example, the backside contacts 51A, 51B, 51C can comprise a wire bondable or solderable metal, such as copper or aluminum, while the conductive vias 49A, 49B, 49C can comprise a material such as nickel.

Figure 5E:
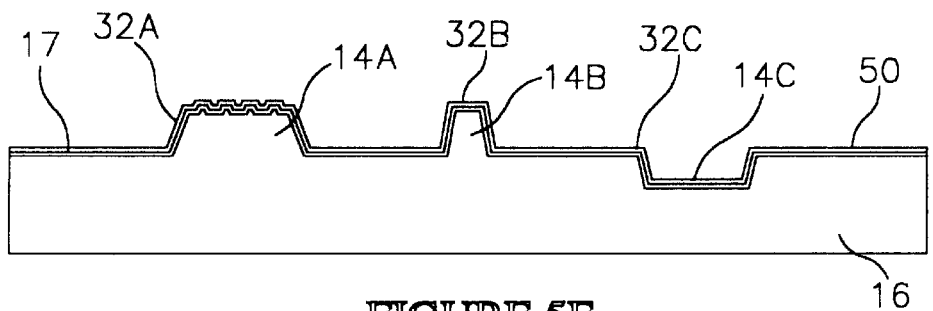
FIGS. 5E–5G are schematic cross sectional views illustrating alternate embodiment process steps for fabricating an interconnect in accordance with the invention.
Figure 5F:
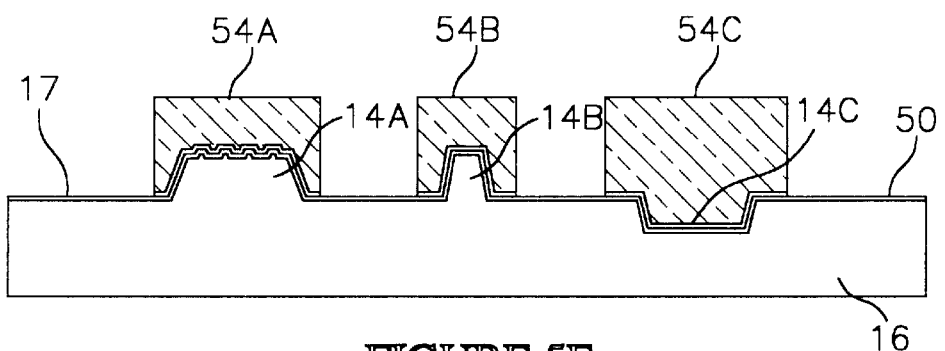

Referring to FIGS. 5E–5F, an alternate embodiment fabrication process for fabricating the interconnect 10W or 10D are illustrated. Initially the interconnect contacts 14A, 14B, 14C and the insulating layers 32A, 32B, 32C are formed on the interconnect contacts 14A, 14B, 14C using the steps previously described and shown in FIGS. 4A–4D.

Next, as shown in FIG. 5E, a silicon carbide layer 50 is conformally blanket deposited on the circuit side surface 17 of the substrate 16 and on the interconnect contacts 14A, 14B, 14C. The silicon carbide layer 50 can be deposited to a desired thickness using a CVD process substantially as previously described. In addition, the silicon carbide layer 50 can include a suitable dopant substantially as previously described, such that electrical conductivity is increased.

Next, as shown in FIG. 5F, etch masks 54A, 54B, 54C are formed on the interconnect contacts 14A, 14B, 14C. The etch masks 54A, 54B, 54C will define the conductive layers 30A, 30B, 30C. Using the etch masks 54A, 54B, 54C the silicon carbide layer 50 can be etched to define the silicon carbide conductive layers 30A, 30B, 30C. The etch masks 54A, 54B, 54C can comprise a hard mask as previously described or a resist mask.

One suitable resist for forming the etch masks 54A, 54B, 54C comprises a thick film resist sold by Shell Chemical under the trademark "EPON RESIN SU-8". The resist can be deposited in layers to a thickness of from about 3–50 mils. The resist also includes an organic solvent (e.g., gamma-butyloracton), and a photoinitiator. A conventional resist coating apparatus, such as a spin coater, or a meniscus coater, along with a mask or stencil, can be used to deposit the resist in viscous form onto the circuit side surface 17 of the substrate 16. The deposited resist can then be partially hardened by heating to about 95° C. for about 15 minutes or longer. In addition, the deposited resist can be exposed and developed prior to further hardening such that only selected portions (e.g., interconnect contacts 14A, 14B, 14C) of the substrate 16 will be covered.

Exposure of the etch masks 54A, 54B, 54C can be with a conventional UV mask writer using a suitable UV dose. A representative UV dose for the previously described resist formulation is about 165 mJ/cm². A suitable wet etchant for etching (i.e., developing) the resist is a solution of PGMEA (propyleneglycol-monomethylether-acetate). Following development the resist can be fully hardened. A "full cure" can be performed with a hard bake at about 200° C. for about 30 minutes.

The silicon carbide layer 50 can then be etched through openings in the etch masks 54A, 54B, 54C to define the silicon carbide conductive layers 30A, 30B, 30C. A suitable etchant for etching the silicon carbide layer comprises a solution of tetrahydrofurfuryl alcohol and potassium nitrite (THFFA/KNO₂).

Figure 5G:
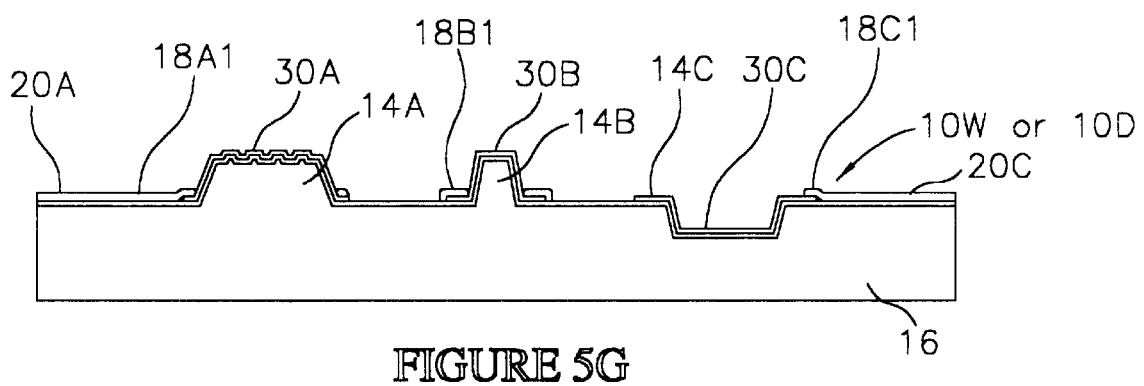

Following the etching step, and as shown in FIG. 5G, the etch masks 54A, 54B, 54C can be stripped using a suitable stripper. A suitable wet etchant for stripping the previously described resist formulation is a solution of PGMEA (propyleneglycol-monomethylether-acetate).

If the silicon carbide layer 50 (FIG. 5E) is not doped then an ion implantation process can be performed on the silicon carbide layer 50 is before or after defining the silicon carbide conductive layers 30A, 30B, 30C. As another alternative, a thermal oxidation process with a focused laser beam can be performed following removal of the etch masks 54A, 54B, 54C to increase the conductivity of the silicon carbide conductive layers 30A, 30B, 30C.

As also shown in FIG. 5G, conductors 18A1, 18B1, 18C1 can be formed on the substrate 16 in electrical communication with the silicon carbide conductive layers 30A, 30B, 30C. The conductors 18A1, 18B1, 18C1 can comprise a thin film metal deposited to a thickness of several hundred Å or more using a process such as CVD. For example, the conductors 18A1, 18B1, 18C1 can comprise a patterned layer of a conductive metal such as aluminum, chromium, titanium, nickel, iridium, copper, gold, tungsten, silver, platinum, palladium, tantalum, molybdenum or alloys of these metals such as TiSi₂. Rather than being a single layer of metal, the conductors 18A1, 18B1, 18C1 can comprise multi-layered stacks of metals (e.g., bonding layer/barrier layer). The bonding pads 20A, 20B, 20C can be formed using a same process as the conductors 18A1, 18B1, 18C1 or can be formed separately out of a wire bondable metal.

Alternately, the conductors 18A1, 18B1, 18C1 and the bonding pads 20A, 20B, 20C can comprise portions of the silicon carbide layer 50 (FIG. 5E). In this case the etch masks 54A, 54B, 54C can be configured to form the silicon carbide conductive layers 30A, 30B, 30C as well as the conductors 18A1, 18B1, 18C1 and the bonding pads 20A, 20B, 20C.

Figure 6E:
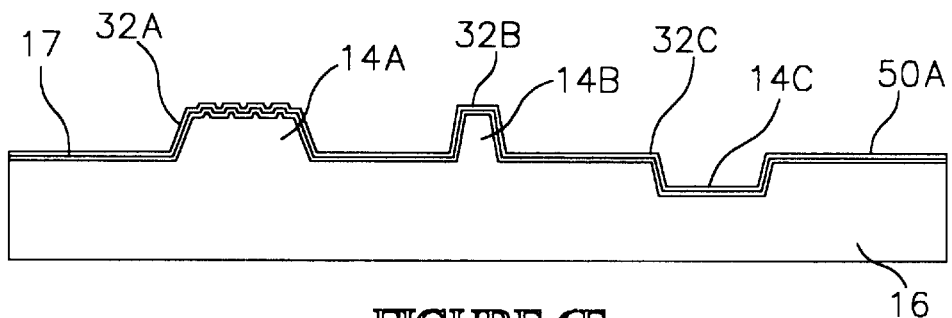
FIGS. 6E–6G are schematic cross sectional views illustrating alternate embodiment process steps for fabricating an interconnect in accordance with the invention.
Figure 6F:
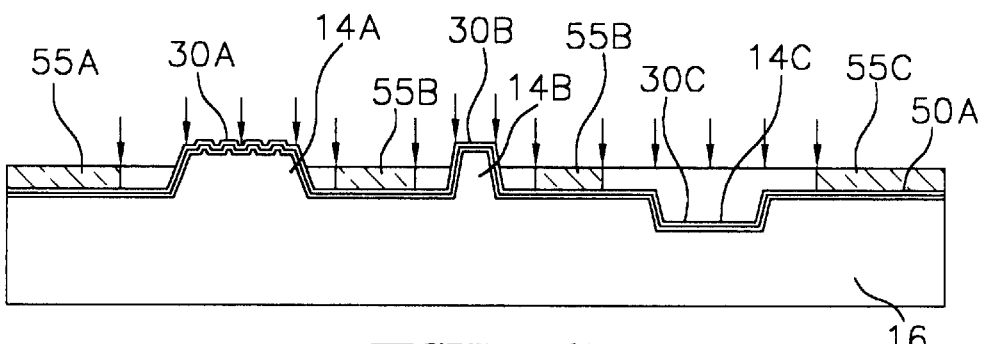
Figure 6G:
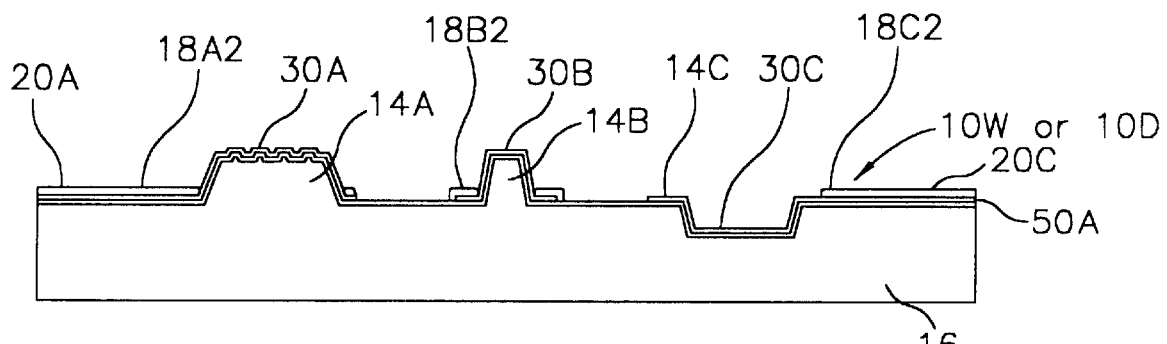

Referring to FIGS. 6E–6G an alternate embodiment fabrication process is illustrated. Initially, the interconnect contacts 14A, 14B, 14C and the insulating layers 32A, 32B, 32C are formed on the interconnect contacts 14A, 14B, 14C using the steps previously described and shown in FIGS. 4A–4D.

Next, as shown in FIG. 6E, a silicon carbide conductive layer 50A can be blanket conformally deposited on the interconnect contacts 14A, 14B, 14C and on the substrate 16. Preferably the silicon carbide conductive layer 50A has a relatively high electrical resistivity (e.g., $1 \times 10^{-11}$ ohm-cm).

Next, as shown in FIG. 6F ion implantation masks 55A, 55B, 55C can be formed on the interconnect contacts 14A, 14B, 14C. In addition, as indicated by the arrows in FIG. 6F, one or more dopants can be implanted into the interconnect contacts 14A, 14B, 14C to form the silicon carbide conductive layers 30A, 30B, 30C. Forming of the masks 55A, 55B, 55C and the ion implantation process can be performed using techniques that are known in the art. The ion implantation process makes the silicon carbide conductive layers 30A, 30B, 30C electrically conductive, while a remainder of the silicon carbide layer 50A remains electrically insulative.

Next, as shown in FIG. 6G, the masks 55A, 55B, 55C can be stripped. In addition, conductors 18A2, 18B2, 18C3, and bonding pads 20A, 20B, 20C can be formed on the silicon carbide layer 50A using a separate metallization process as previously described. In the completed interconnect 10W or 10D, the silicon carbide layer 50A completely covers the substrate 16, such that a high thermal conductivity is provided for heat dissipation. In addition, the silicon carbide conductive layers 30A, 30B, 30C and the conductors 18A2, 18B2, 18C3 provide low resistivity electrical paths for signal transmission.

Alternately, rather than an ion implantation process, an oxidation process, using a focused laser beam as previously described, can be used to form the silicon carbide conductive layers 30A, 30B, 30C. In this case the laser beam can be focused through openings in a mask aligned with the interconnect contacts 14A, 14B, 14C substantially as shown in FIG. 6F. As another alternative, the silicon carbide conductive layers 30A, 30B, 30C, the conductors 18A2, 18B2, 18C3 and the bonding pads 20A, 20B, 20C can all be formed by oxidation of the blanket deposited silicon carbide layer 50A (FIG. 6E). In this case, the silicon carbide layer 50A covers the substrate 16, while selected portions thereof are electrically conductive for signal transmission.

Wafer Level Test System

Figure 7:
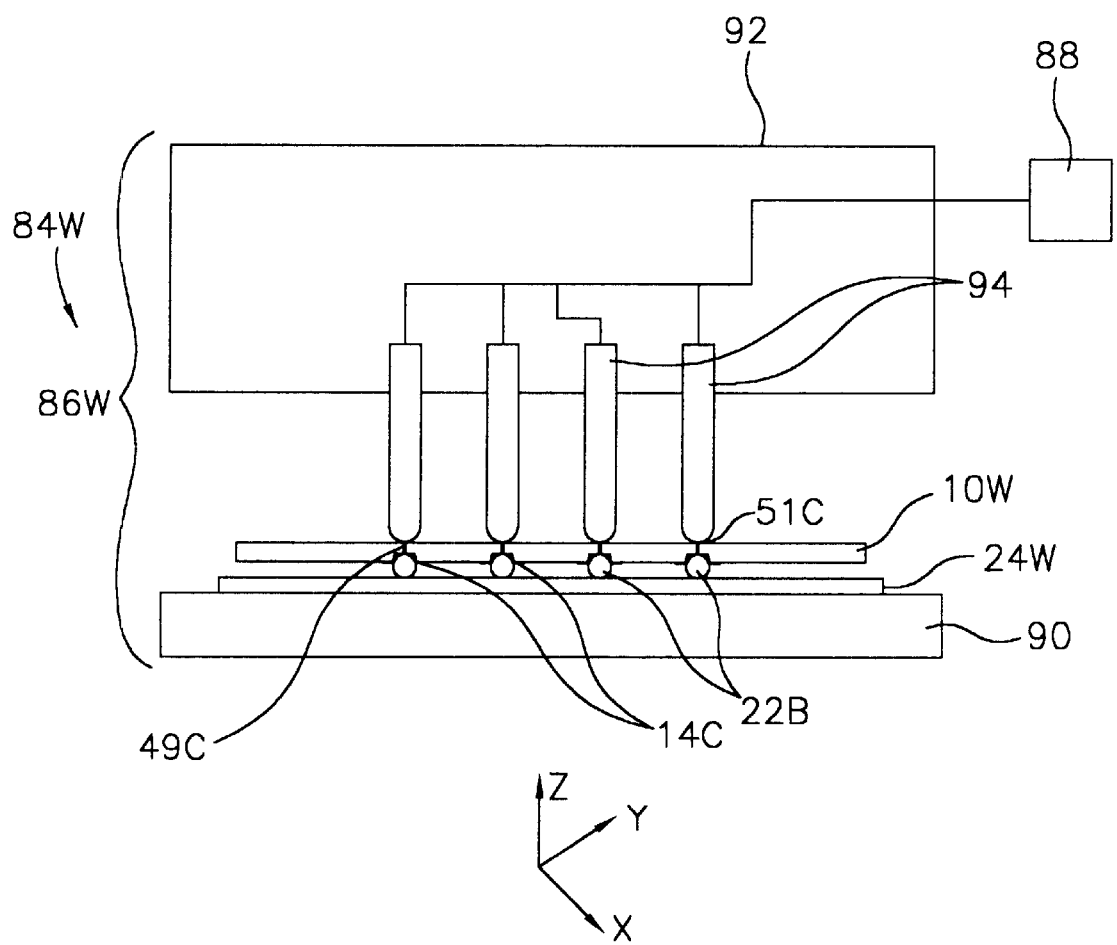
FIG. 7 is a schematic diagram of a wafer level test system constructed in accordance with the invention.

Referring to FIG. 7, a wafer level test system 84W suitable for testing a wafer sized semiconductor component 24W with bumped component contacts 22B is illustrated. The semiconductor component 24W can comprise a semiconductor wafer containing bare dice, a wafer or panel containing chip scale packages, a printed circuit board containing semiconductor dice, or an electronic assembly, such as a field emission display containing semiconductor dice.

The wafer level test system 84W includes an interconnect 10W constructed in accordance with the invention as previously described, and mounted to a testing apparatus 86W. The testing apparatus 86W includes, or is in electrical communication with test circuitry 88. The testing apparatus 86W can comprise a conventional wafer probe handler, or probe tester, modified for use with the interconnect 10W. The testing apparatus 86W can also comprise a wafer level burn-in system. Wafer probe handlers and associated test equipment are commercially available from Electroglass, Advantest, Teradyne, Megatest, Hewlett-Packard and others. In this system 84W, the interconnect 10W takes the place of a conventional probe card.

The interconnect 10W includes the previously described interconnect contacts 14C configured to establish electrical communication with the bumped component contacts 22B. The interconnect 10W also includes the previously described conductive vias 49C in electrical communication with the contacts 14C and the backside contacts 51C. Alternately, the interconnect 10W can be configured with previously described contacts 14A or 14B.

The testing apparatus 86W also includes a wafer chuck 90 configured to support and move the component 24W in x, y and z directions as required. In particular, the wafer chuck 90 can be used to step the component 24W so that the semiconductor dice or semiconductor packages on the component 24W can be tested in groups. Alternately, the interconnect 10W can be configured to contact all of the bumped component contacts 22B for all of the dice on the component 24W at the same time. Test signals can then be selectively applied and electronically switched as required, to selected dice on the component 24W.

As also shown in FIG. 7, the interconnect 10W can mount to a probe card fixture 92 of the testing apparatus 86W. The probe card fixture 92 can be similar in construction to a conventional probe card fixture commercially available from manufacturers such as Packard Hughes Interconnect and Wentworth Laboratories. The probe card fixture 92 can be formed of an electrically insulating material such as FR-4 or ceramic. In addition, the testing apparatus 86W can include a force applying mechanism in the form of multiple spring loaded electrical connectors 94 associated with the probe card fixture 92. The spring loaded electrical connectors 94 are in electrical communication with the testing circuitry 88.

The spring loaded electrical connectors 94 can be formed in a variety of configurations. One suitable configuration is known as a "POGO PIN" connector. This type of electrical connector includes a spring loaded pin adapted to contact and press against a flat or bumped surface to form an electrical connection. Pogo pin connectors are manufactured by Pogo Instruments, Inc., Kansas City, Kans. The spring loaded electrical connectors 94 can also comprise wires, pins or cables formed as spring segments or other resilient members.

In this embodiment the spring loaded electrical connectors 94 electrically contact the contact backside contacts 51C on the interconnect 10W. This arrangement provides separate electrical paths from the testing circuitry 88, through the spring loaded electrical connectors 94, through the backside contacts 51C, through the conductive vias 49C and through the contacts 14C to the bumped component contacts 22B. During a test procedure, test signals can be applied to the integrated circuits on the component 18W using these separate electrical paths.

In addition to establishing electrical communication with the interconnect 10W, the spring loaded electrical connectors 94 also provide a mechanical force necessary for biasing the interconnect 10W against the component 24W. Further details of a wafer level system similar to the system 86W are contained in U.S. patent application Ser. No. 08/797,719, filed Feb. 10, 1997, now U.S. Pat. No. 6,060,891, entitled "Probe Card For Semiconductor Wafers and Method and System For Testing Wafers" which is incorporated herein by reference.

Die Level Test System

Figure 8A:
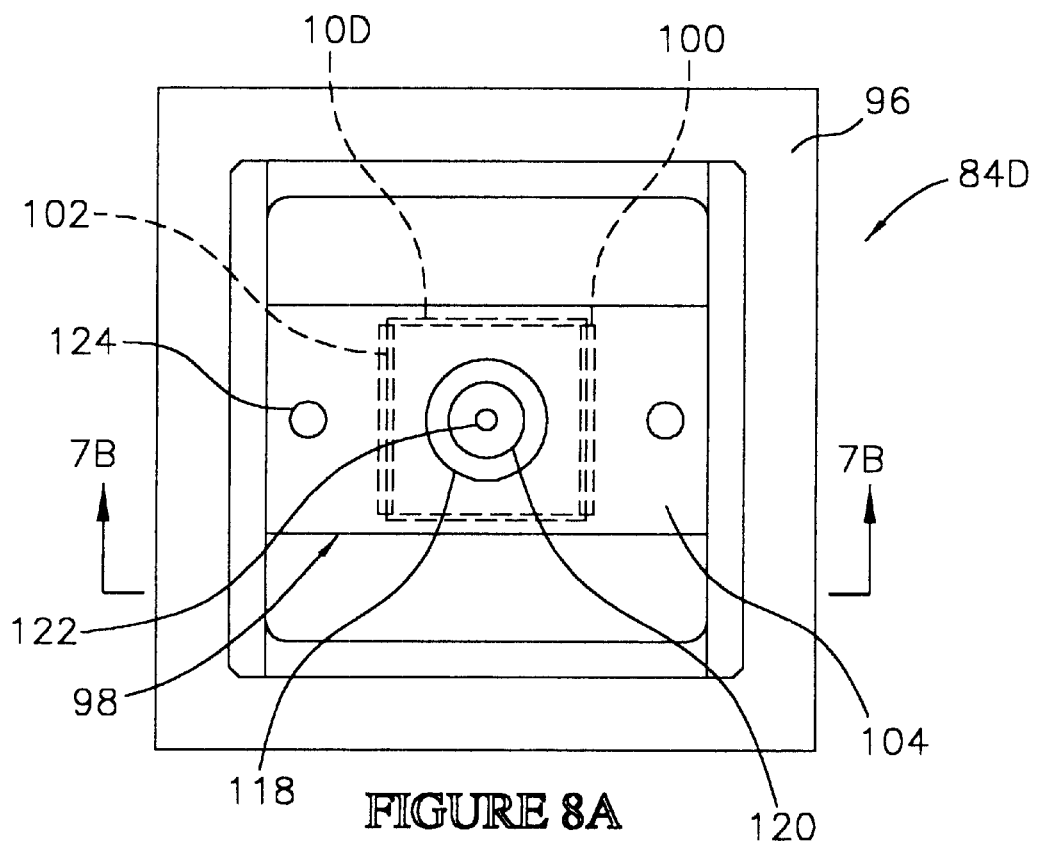
FIG. 8A is a plan view of a die level test system constructed in accordance with the invention.
Figure 8B:
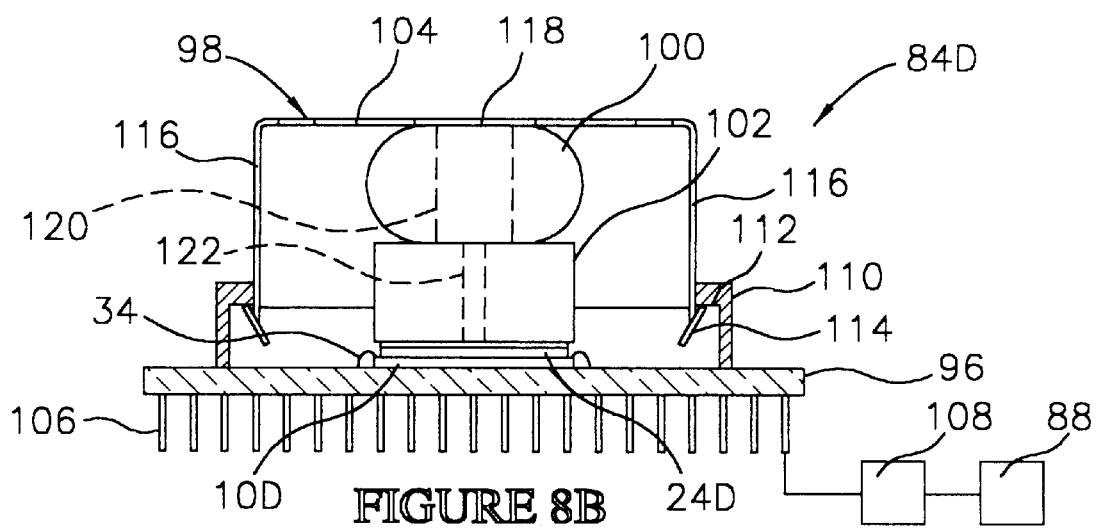
FIG. 8B is a cross sectional view taken along section line 8B—8B of FIG. 8A.

Referring to FIGS. 8A–8B, a die level test system 84D constructed with a die level interconnect 10D constructed in accordance with the invention is illustrated. The test system 84D comprises a test carrier adapted to temporarily package a die-sized semiconductor component 24D, such as a bare die, or a chip scale package, for testing and burn-in.

The test system 84D includes a base 96, and the interconnect 10D mounted to the base 96. The test system 84D also includes a force applying mechanism 98 comprising a biasing member 100, a pressure plate 102, and a clamp 104. In addition, the base 96 includes a plurality of terminal leads 106 in electrical communication with the interconnect contacts 14A (FIG. 2A), 14B (FIG. 2B) or 14C (FIG. 2C) on the interconnect 10D.

The terminal leads 106 are adapted for electrical communication with a test apparatus 108 (FIG. 8B), such as a burn-in board, and test circuitry 88 (FIG. 8B). The test circuitry 88 generates test signals, and transmits the test signals to the terminal leads 106, and through the interconnect 10D to the component 18D. The test circuitry 88 also analyzes the resultant test signals transmitted from the component 24D. This arrangement permits various electrical characteristics of the component 24D to be evaluated.

In the illustrative embodiment, the terminal leads 106 comprise pins formed in a pin grid array (PGA) on a backside of the base 96. Alternately, other configurations for the terminal leads 106 can be provided. For example, the carrier base 96 can include ball contacts in a ball grid array (BGA) or fine ball grid array (FBGA).

The base 96 can comprise a laminated ceramic material fabricated using a ceramic lamination process with a desired geometry, and with metal features such as internal conductors and external pads. U.S. Pat. No. 5,519,332, entitled "Carrier For Testing An Unpackaged Semiconductor Die", which is incorporated herein by reference, describes a ceramic lamination process for fabricating the base 96. Alternately, rather than ceramic, the base 96 can comprise plastic, and the metal features formed using a 3-D molding process. Previously cited U.S. Pat. No. 5,519,332 describes a 3-D molding process for fabricating the base 96.

The base 96 includes internal conductors (not shown) in electrical communication with the terminal leads 106. In addition, bond wires 34 are wire bonded to bond pads on the base 96 in electrical communication with the internal conductors in the base 96. The bond wires 44 are also wire bonded to the bonding pads 20A, 20B, 20C (FIG. 1B) on the interconnect 10D, and establish electrical communication between the terminal leads 106 on the base 96, and the interconnect contacts 14A (FIG. 2A), 14B (FIG. 2B) or 14C (FIG. 2C) on the interconnect 10D.

The base 96 also includes a clamp ring 110 for attaching the clamp 104 of the force applying mechanism 98 to the base 96 during assembly of the test system 84D. The clamp ring 110 is attached to the base 96, and as shown in FIG. 9A, has a frame-like configuration. As also shown in FIG. 9B, the clamp ring 110 includes grooves 112 wherein the clamp 104 is attached. In the illustrative embodiment, the clamp ring 110 comprises metal, and is attached to the base 96 using a brazing process. One suitable metal for the clamp ring 110 comprises "KOVAR" coated with gold. The base 96 can include bonding features, such as metal pads, for attaching the clamp ring 110.

The clamp 104 comprises a flexible bridge-like structure formed of a resilient material such as steel. The clamp 104 includes tabs 114 that physically engage the grooves 112 on the clamp ring 110. In addition, the clamp 104 includes opposed sides 116 movable towards one another to permit engagement of the tabs 114 on the clamp 104, with the grooves 112 on the clamp ring 110. The clamp 104 also includes an opening 118 which provides access to the component 24D for a vacuum assembly tool during assembly of the test system 84D. The biasing member 100 also includes an opening 120, and the pressure plate 102 includes an opening 122 for the vacuum assembly tool. A pair of openings 124 (FIG. 8A) can also be provided on the clamp 104 for manipulation of the clamp 104 by the vacuum assembly tool during assembly of the test system 84D.

The pressure plate 102 can comprise a metal, a plastic, or a ceramic material. A peripheral shape and thickness of the pressure plate 102 can be selected as required.

Assembly of the test system 84D can be accomplished manually, or using an automated assembly apparatus. U.S. Pat. No. 5,796,264, entitled "Apparatus For Manufacturing Known Good Semiconductor Dice", which is incorporated herein by reference, describes a method and apparatus for assembling the carrier. In the illustrative embodiment, alignment of the component 24D with the interconnect 10D can be performed using an optical alignment technique. Such an optical alignment technique is described in the above cited U.S. Pat. No. 5,796,264. Alignment of the component 24D with the interconnect 10D can also be performed using a mechanical alignment fence. Using the test system 84D the component 24D can be tested as required.

Electronic Assembly

Figure 9:
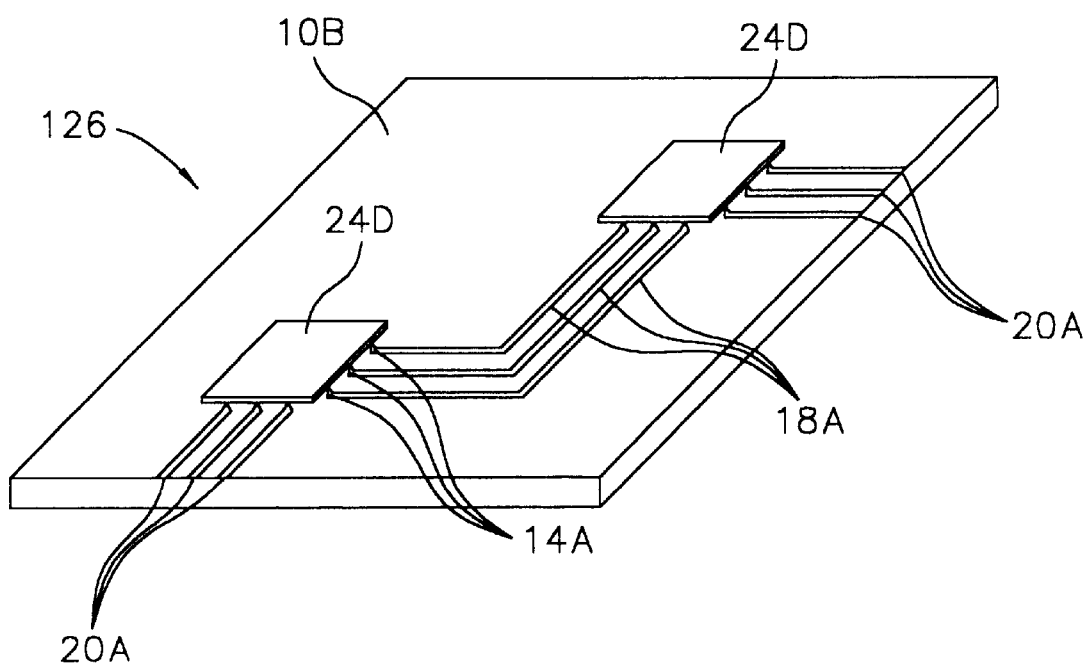
FIG. 9 is a schematic perspective view of an electronic assembly constructed in accordance with the invention.

Referring to FIG. 9, an electronic assembly 126 constructed in accordance with the invention is illustrated. The electronic assembly 126 includes a board level interconnect 10B configured similarly to a printed circuit board, or a multi chip module substrate. The board level interconnect 10B includes a plurality of patterns of interconnect contacts 14A constructed with silicon carbide conductive layers 30A (FIG. 2A) substantially as previously described. In addition, the board level interconnect 10B includes patterns of conductors 18A and bonding pads 20A in electrical communication with the interconnect contacts 14A.

The electronic assembly 126 also includes a plurality of semiconductor components 24D attached to the interconnect contacts 14A. Attachment of the semiconductor components 24D can be accomplished by bonding the silicon carbide conductive layers 30A (FIG. 2) to the component contacts 22A (FIG. 2A) using heat and pressure. Alternately bonding can be accomplished by soldering, welding or application of a conductive adhesive.

Thus the invention provides an improved interconnect for semiconductor components and a method for fabricating the interconnect. While the invention has been described with reference to certain preferred embodiments, as will be apparent to those skilled in the art, certain changes and modifications can be made without departing from the scope of the invention as defined by the following claims.

What is claimed is:

1. A system for testing a semiconductor component comprising:
    a testing apparatus; and
    an interconnect on the testing apparatus comprising a substrate and a plurality of first contacts on the substrate configured to electrically engage a plurality of second contacts on the component, the first contacts comprising projections at least partially covered by electrically conductive silicon carbide layers configured to penetrate the second contacts.

2. The system of claim 1 wherein the silicon carbide layers comprise oxidized silicon carbide.

3. The system of claim 1 wherein the silicon carbide layers comprise conductors configured for signal transmission.

4. The system of claim 1 wherein the testing apparatus comprises a wafer prober and the component comprises a wafer sized component.

5. The system of claim 1 wherein the testing apparatus comprises a test carrier and the component comprises a die sized component.

6. A system for testing a semiconductor component comprising:
   a testing apparatus; and
   an interconnect on the testing apparatus comprising a substrate having a surface and a plurality of first contacts on the surface configured to electrically engage a plurality of second contacts on the component, the first contacts at least partially covered by oxidized silicon carbide layers.

7. The system of claim 6 wherein the first contacts comprise projections configured to penetrate the second contacts.

8. The system of claim 6 wherein the testing apparatus comprises a wafer prober and the component comprises a wafer sized component.

9. The system of claim 6 wherein the testing apparatus comprises a test carrier and the component comprises a die sized component.

10. A system for testing a semiconductor component comprising:
    a testing apparatus; and
    an interconnect on the testing apparatus comprising a plurality of first contacts configured to electrically engage a plurality of second contacts on the component, the second contacts comprising bumps, and the first contacts comprising recesses configured to retain the bumps and at least partially covered by electrically conductive silicon carbide layers.

11. The system of claim 10 wherein the recesses include projections at least partially covered by the silicon carbide layers configured to penetrate the second contacts.

12. The system of claim 10 wherein the silicon carbide layers comprise a plurality of conductors on the interconnect.

13. The system of claim 10 further comprising a plurality of electrically conductive vias in the interconnect in electrical communication with the silicon carbide layers.

14. The system of claim 10 wherein the testing apparatus comprises a wafer prober and the component comprises a wafer sized component.

15. The system of claim 10 wherein the testing apparatus comprises a test carrier and the component comprises a die sized component.

16. A system for testing a semiconductor component comprising:
    a testing apparatus; and
    an interconnect on the testing apparatus comprising a plurality of first contacts configured to electrically engage a plurality of second contacts on the component;
    a plurality of electrically conductive silicon carbide conductive layers covering the first contacts; and
    a plurality of conductors on the interconnect in electrical communication with the silicon carbide conductive layers.

17. The system of claim 16 wherein the conductors comprise silicon carbide.

18. The system of claim 16 wherein first contacts comprise projections configured to penetrate the second contacts.

19. The system of claim 16 wherein the first contacts comprise recesses configured to retain the second contacts.

20. The system of claim 16 wherein the testing apparatus comprises a wafer prober and the component comprises a wafer sized component.

21. The system of claim 16 wherein the testing apparatus comprises a test carrier and the component comprises a die sized component.

22. An electronic assembly comprising:
    an interconnect comprising a substrate and a plurality of contacts on the substrate at least partially covered by silicon carbide layers; and
    at least one semiconductor component on the interconnect comprising a plurality of component contacts bonded to the silicon carbide layers.

23. The assembly of claim 22 wherein the interconnect comprises a circuit board.

24. The assembly of claim 22 wherein the interconnect comprises a module substrate and the assembly comprises a module.

25. The assembly of claim 22 wherein the silicon carbide layers comprise oxidized silicon carbide.

26. The assembly of claim 22 wherein the silicon carbide layers comprise conductors configured for signal transmission.

27. The assembly of claim 22 wherein the at least one semiconductor component comprises a semiconductor die or a semiconductor package.

28. An electronic assembly comprising:
    an interconnect comprising a substrate and a plurality of contacts on the substrate comprising projections at least partially covered by silicon carbide layers; and
    at least one semiconductor component on the interconnect comprising a plurality of component contacts penetrated by and bonded to the silicon carbide layers.

29. The assembly of claim 28 wherein the interconnect comprises a circuit board.

30. The assembly of claim 28 wherein the interconnect comprises a module substrate and the assembly comprises a module.

31. The assembly of claim 28 wherein the silicon carbide layers comprise oxidized silicon carbide.

32. The assembly of claim 28 wherein the silicon carbide layers comprise conductors configured for signal transmission.

33. The assembly of claim 28 wherein the at least one semiconductor component comprises a semiconductor die or a semiconductor package.

34. The assembly of claim 28 wherein the component contacts comprise bumps and the first contacts comprise recesses containing the bumps.

35. The assembly of claim 28 wherein the component contacts are soldered, welded or conductive adhesively bonded to the contacts.

* * * * *